US006683665B1

(12) United States Patent
Matthies

(10) Patent No.: US 6,683,665 B1
(45) Date of Patent: Jan. 27, 2004

(54) TILED ELECTRONIC DISPLAY STRUCTURE AND METHOD FOR MODULAR REPAIR THEREOF

(75) Inventor: Dennis Lee Matthies, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 352 days.

(21) Appl. No.: 09/716,535

(22) Filed: Nov. 20, 2000

(51) Int. Cl.$^7$ ............................................. G02F 1/1333
(52) U.S. Cl. ......................................... 349/73; 349/187
(58) Field of Search ............................. 349/73, 22, 110, 349/153, 155, 187

(56) References Cited

U.S. PATENT DOCUMENTS

| | | | |
|---|---|---|---|
| 3,828,215 A | 8/1974 | Bilsback | |
| 4,471,263 A | 9/1984 | Harvey | |
| 4,508,990 A | 4/1985 | Essinger | |
| 4,515,440 A | * 5/1985 | Mosier | ........................ 349/73 |
| 4,792,500 A | 12/1988 | Kojima | |
| 4,843,280 A | 6/1989 | Lumbard et al. | |
| 5,281,805 A | 1/1994 | Sauer | |
| 5,317,236 A | 5/1994 | Zavracky et al. | |
| 5,661,531 A | 8/1997 | Greene et al. | |
| 5,668,569 A | 9/1997 | Greene et al. | |
| 5,867,236 A | 2/1999 | Babuka et al. | |
| 5,889,568 A | * 3/1999 | Seraphim et al. | ............. 349/73 |
| 6,005,653 A | * 12/1999 | Matsuzawa | .................. 349/154 |
| 6,078,379 A | * 6/2000 | Nagae et al. | ............... 349/155 |
| 6,370,019 B1 | * 4/2002 | Matthies et al. | ............ 361/681 |
| 6,461,775 B1 | * 10/2002 | Pokorny et al. | ................ 430/7 |

OTHER PUBLICATIONS

G. Mueller, R. Mach, G. U. Reinsperger, L. Schrottke; "Tiling Thin–Film Electroluminescent Displays," SID 91 Digest, pp 567–570.
S.C. Thayer, "Late–News Paper: Modular Wall–Size IC–Driven Flat–Panel Displays," SID 92 Digest pp. 950–953.
N. Mazurek, T. Zammit, "A 51–in.–Diagonal Tiled LCD VGA Monitor," SID 93 Digest, pp. 614–617.
S. C. Thayer, "Active–Driven TFEL Displays Using Ceramic Tiling," SID 93 Digest, pp. 618–621.

* cited by examiner

Primary Examiner—Robert H. Kim
Assistant Examiner—P. R. Akkapeddi
(74) Attorney, Agent, or Firm—William J. Burke

(57) ABSTRACT

A tiled display structure is formed containing a plurality of image tiles. A method for assembling a tiled display structure that includes a transparent front panel and a plurality of image tiles is disclosed. The method includes the steps of: (1) heating a heat activated adhesive to a working temperature; (2) applying the softened adhesive to the front surface of the display section of an image tile, or the inner surface of the transparent front panel; (3) aligning the surface of the display section of the image tile with the inner surface of the transparent front panel; (4) cooling the adhesive. Another aspect of the invention is a modular method of repairing a tiled display structure, which includes a transparent front panel, a heat activated adhesive, and a plurality of image tiles.

26 Claims, 9 Drawing Sheets

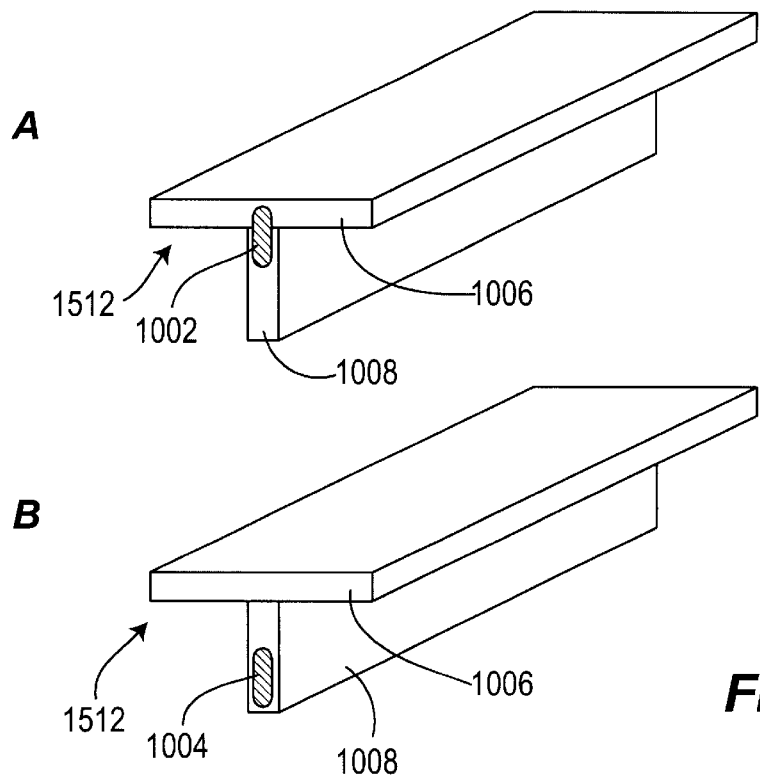
FIG. 10
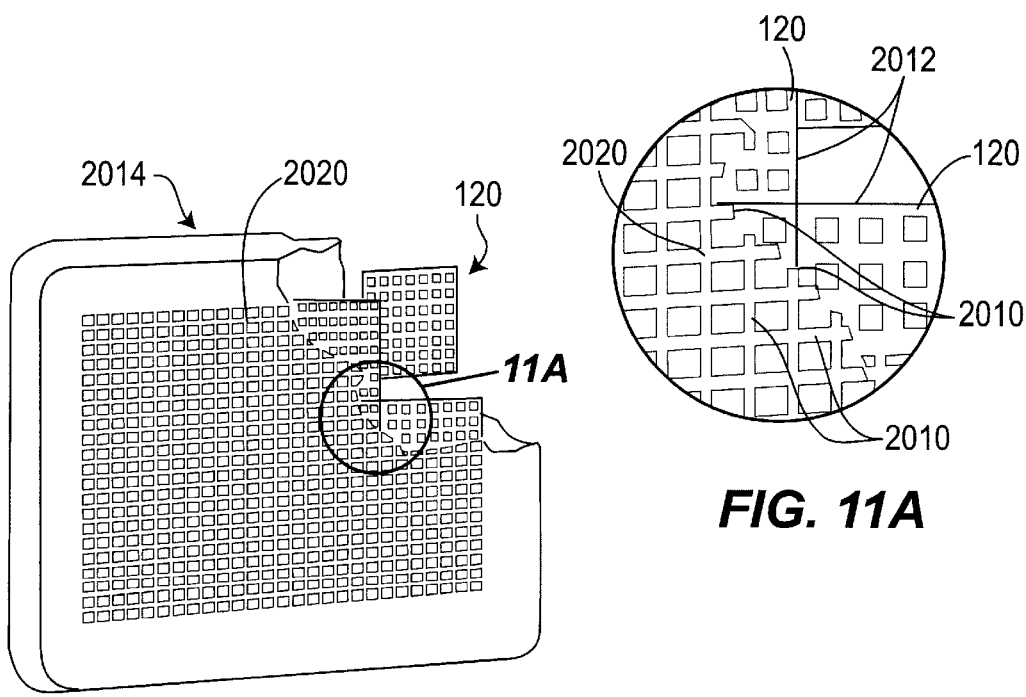
FIG. 11
FIG. 11A

TILED ELECTRONIC DISPLAY STRUCTURE AND METHOD FOR MODULAR REPAIR THEREOF

BACKGROUND OF THE INVENTION

The present invention concerns electronic display devices and, in particular, a method for repairing tilemodules in large-area display devices that are formed as an array of tiled display devices.

There is an unmet need for large-area flat displays. No clear solution is apparent in the market place. This unmet need is becoming increasingly critical since the advancement of information results in increasing amounts of data to be displayed. A solution for large-area displays is needed to serve as the human interface for conveying information from sensors, computers, databases, cameras, etc. in this information dominated age. Many critical applications demand large-area displays:

Home theater applications

Applications that require multiple viewers

Applications in which the user needs to move about in an area

Applications where simulation of the real world is needed for training.

The requirements for each application differs in size, shape, total number of picture elements (pixels), and brightness. Requirements that are common to most applications include, a relatively large number of pixels, color, ruggedness, portability (minimum thickness and weight), reliability, low power, and affordable cost. A good display solution does not exist for these needs using present technology.

There are fundamental technical issues that impose scaling-laws and limit the complexity and size of displays that can be profitably manufactured. These fundamental limitations are one reason why a technical solution that meets the need for large-area displays has not been achieved.

One measure of the complexity of a display device is its total number of pixels. The evolution of display technology has made newer and more complex pixel formats possible—VGA, SVGA, XGA, and SXGA for instance. Increased complexity typically is accompanied by added costs. The underlying cause of this empirical complexity law is yield losses caused by random material or particle defects. These defects cause manufacturing yields to diminish as the number of pixels in the display increases.

The measure of size of the display is its area. Costs increase exponentially with size. Each technology, LCD, PDP, EL, etc., has its own limit on maximum size. The underlying technical cause of this empirical relationship is tolerance. It is desirable to hold tight tolerances in manufacturing displays because, as the size increases, the effects of thermal expansion, humidity, residual stresses, and physical sag become more important.

Building a large-area display out of smaller tiles has been recognized as a desirable solution. Tiling is an approach that provides great flexibility for size and shape. Tiling is not subject to many of the problems that limit the size of monolithic display technologies. The complexity law does not apply because, depending on the size of the tile, the basic unit of manufacture in tiled displays is less complex than a large, monolithic multipixel display. The size law is not a limiting factor because the basic unit of manufacture is relatively small. Tiled displays obey a scaling-law which is not exponential but linear with display area. This fundamentally different scaling behavior is one advantage of tile technology. It makes these displays possible and reduces manufacturing costs.

These same issues lead to a desire to provide a repair means for large-area display devices, particularly the issues of ruggedness, reliability, and affordable price. The smaller the unit that must be replaced, or repaired, when a defect occurs, the less the expense incurred in the repair. Again tiling may provide-an answer, through the approach of modular repair. In a tiled display the individual tiles are desirably inexpensive, relatively, to manufacture. A system designed to allow for the replacement of an individual tile is, therefore, less expensive to repair. Also the expense of the repair would depend on the size and complexity of the individual tiles, not the size and complexity of the entire display, eliminating the scaling-law issue of large-area displays with regard to their repair.

One type of tiled display is disclosed in U.S. patent application Ser. No. 09/250,324 filed on Feb. 16, 1999, which is incorporated herein by reference for its teaching on tiled displays. This application describes an OLED display which is formed as tiles that may be joined together to provide a large-area display device.

SUMMARY OF THE INVENTION

The present invention is embodied in a tiled display structure containing a plurality of image tiles. The plurality of image tiles are coupled to a transparent front panel of the display structure using a heat-activated adhesive.

The present invention is embodied in a method for assembling a tiled display structure that includes a transparent front panel and a plurality of image tiles, each of which includes a display section. The first step of this exemplary method is to heat a heat activated adhesive to a working temperature. The working temperature is above the softening point temperature of the adhesive and below a damage threshold temperature of the tiles. The softened adhesive is applied to at least one of: the front surface of the display section of an image tile, or the inner surface of the transparent front panel. Next the surface of the display section of the image tile is aligned with the inner surface of the transparent front panel such that the adhesive forms a thin layer between the two surfaces. Then the adhesive is cooled below the softening point temperature to couple the tile to transparent front panel.

Another aspect of the present invention is a method of repairing a tiled display structure, which includes a transparent front panel, a heat activated adhesive, and a plurality of image tiles, each image tile including a display section. The first step of this exemplary method is to heat the heat activated adhesive in a region of the tiled display structure corresponding to a defective tile to a working temperature. The working temperature is above the softening point temperature of the adhesive and below a damage threshold temperature of the tiles. The defective tile is then pulled away from the inner surface of the transparent front panel.

Once the defective tile has been removed, heated heat activated adhesive may be applied to at least one of: the front surface of the display section of a replacement image tile, and the inner surface of the transparent front panel in the region of the defective tile. The surface of the display section of the replacement image tile is aligned with the portion the inner surface of the transparent front panel in the region of the defective tile such that the adhesive forms a thin layer between the surface of the display section of the replacement image tile and the inner surface of the front panel. The adhesive is then cooled below the softening point temperature to couple the replacement tile to the transparent front panel.

BRIEF DESCRIPTION OF THE DRAWINGS

FIG. 10A is a perspective view of an exemplary row mullion, which may used in modular display repair.

FIG. 10B is a perspective view of an exemplary column mullion which may used in modular display repair.

FIG. 11 is a partially exploded perspective view of the tiled display shown in FIG. 1 which is useful for describing an exemplary mounting method and an exemplary implementation of a black matrix for the tiled display.

FIG. 11A is a detailed view of a portion of the partially exploded perspective view shown in FIG. 11.

DETAILED DESCRIPTION

Figure 1:
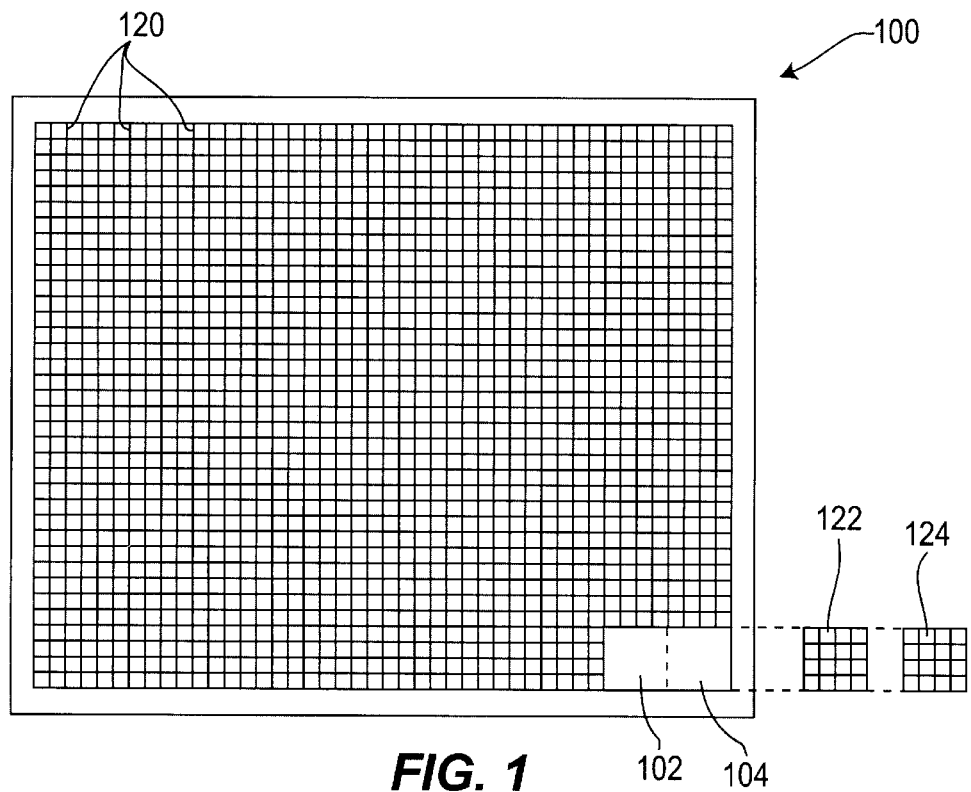
FIG. 1 is a front plan drawing of an exemplary large area display device from which two tiles have been removed.

The invention is described in terms of exemplary embodiments that are illustrated in the drawing figures. The drawing figures are not to scale. Indeed, dimensions of the drawing figures are exaggerated to aid in the description of the invention. Although the invention is described in terms of an optical light emitting diode (OLED) display device, it is contemplated that it may be practiced with other emissive display technologies such as electroluminescent, light emitting diode (LED) or plasma technology; or with reflective display technologies such as Bistable, Reflective Cholesteric (BRC) liquid crystal technology.

FIG. 1 is a front plan view of a partially assembled large-area display 100 according to the present invention. The display 100 is a tiled display in which emissive or reflective elements, on which the image pixels are formed, are built as relatively small arrays on tiles 120 and assembled into a frame to produce the large-area display having a large number of pixel forming elements. Alternatively, the tiles may be assembled side-to-side with their pixels aligned in rows and columns without a frame. In this instance, the individual tiles may be held together by mullions.

The tiles are constructed with pixel forming elements evenly spaced up to the edges of the tiles. As described below with reference to FIGS. 4 through 11A, the tiles are formed such that, when they are joined, the inter-pixel distance between the edge pixels of two adjacent tiles is the same as the inter-pixel distance of adjacent pixels in the interior of a tile. The display shown in FIG. 1 is missing two tiles 122 and 124. These tiles are inserted into the positions 102 and 104 to complete the display.

Although the display 100 is shown as being formed from tiles having 16 pixel forming elements in a four by four array, it is contemplated that each tile may include many more pixels. In one exemplary embodiment of the invention, described below, each tile includes 6400 pixel-forming elements arranged as a 80 by 80 matrix. These tile sizes are only exemplary. It is contemplated that each tile may include more or fewer pixel forming elements. In addition, it is contemplated that a single display may be formed from tiles having different numbers of pixel forming elements. For example, a display may have tiles with relatively large numbers of pixel forming elements near the center and tiles having relatively small numbers of pixel forming elements near the edges.

In one exemplary embodiment of the invention, the pixel forming elements are made from an organic light emitting diode (OLED) material. The basic light emitting structure consists of a thin organic polymer layer sandwiched between a pair of appropriately selected and patterned electrodes. Current flowing from one electrode to the other electrode causes the organic polymer to emit light. At least one of the electrodes is desirably transparent to the emitted light. Indium tin-oxide is the usual material used for this purpose. OLED materials provide high brightness and high efficiency, and are relatively low cost materials.

An exemplary display structure according to the present invention is formed in two parts: a display section and an electronics section. These two parts are made separately and then joined to form a complete tile. The display section consists of a transparent glass layer on which are transparent column electrodes are deposited. The OLED material is deposited onto these layers, as the active (i.e., light-emitting) medium. Row electrodes are deposited as the final display layer. Additional layers such as blocking or passivation layers may be present to improve the function or life of the display layers. The transparent electrode is preferably the hole-injecting electrode and the other electrode is preferably the electron-injecting electrode. The OLED materials between the electrodes are preferably conjugated polymer materials that are applied by thick film processes; however, small molecule materials can alternatively be applied by various thin film deposition techniques. The layers are patterned so that there is electrical access to each row and column at one or more points.

As an alternative to the OLED materials, the pixel forming elements of the tiles may be any of a number of emissive devices such as electroluminescent elements, light emitting diodes, field emissive elements, plasma elements or cathodoluminescent elements.

The electronics section is formed by punching or drilling vias through the circuit board and then printing or otherwise depositing the conductive traces on the circuit board. The conductive ink or paste used to form the conductive traces may also fill the vias. The vias make contact with the row and column electrodes of the display section when the electronics section and the display section are joined to form a tile.

Although it is not illustrated, another exemplary embodiment of the present invention includes a pixel forming structure that is appropriate for applications in which either a reflective or low power display is needed. The substrate and the electronics of this new structure are essentially the same as described below for the OLED embodiments. The display layer in this alternative embodiment, however, is a reflective display material. For example, a Bistable, Reflective Cholesteric (BRC) liquid crystal material which provides for a low power, bistable display. The disclosed tile structure enables, for the first time, video-rate displays in large area BRC displays. These materials switch between a planar, reflective state and a relatively transparent focal conic state. Utilizing a black backing, these two states may appear colored and black. The BRC materials offer distinct advantages for large area tiled displays: the operation between a reflecting and transparent state, combined with a black back-plane makes possible bright, high contrast displays under a variety of lighting conditions; and the bistability also allows for maintaining static images with no power applied.

One exemplary tile structure consists of a multilayer ceramic circuit board 132 that serves as a substrate upon which: the display material is mounted on the viewer side while the electronics 134 (active and passive) for drive or other functions are mounted mostly on the back side. Conductor elements 132 are printed on the individual layers to provide interconnections between the electronics and the display material, vias interconnect the conductors in different layers; and connectors are provided on the back surface to connect to external power and signal sources. The tile structure may also have a structural layer(s) such as a high softening point metal or insulator to provide freedom from distortion during the processing of the ceramic materials, and/or thermal management during the operation of the display. The tile structure also contains a transparent layer (e.g. glass) on the viewer surface to protect or contain the display material. A back panel structure is provided to mount the individual tiles and to provide electrical connection to the power and drive signals needed by each individual tile structure.

The Multilayer ceramic circuit board 130 may be formed of layers of ceramic material. The layers are first formed and processed to form vias, conductors, and other features and then assembled in a stack taking care to carefully align each layer with those layers adjacent to it. Ceramic material here is meant in the broadest sense to include ceramics, glass ceramics, glass, and other high temperature insulating materials. The multiple layers together with the connectors and vias provide the basic function of a circuit board upon which active and passive electrical devices and circuits can be placed.

The conductors 132 may be thin and/or thick film conductors formed by any of the standard processes including, for example plating, evaporation, sputtering, printing and laminating. The materials may be metals or organic conductors. The conductors may be patterned by processes that may include, for example, printing or photolithography. These conductor patterns are formed on the surfaces of the individual layers in the disclosed structure and connect to the vias to provide, according to the design of the device a means of interconnecting the electronics on and external to the disclosed structure to the display material.

Another class of conductors is used to interconnect the layers. These conductors are called vias. Via is used in the broadest sense and includes conductors that go through openings in the layers, including the substrate and those that go around the edge of a layers. Vias that go through a layer can be formed, for example, by making a hole in the layer and filling that hole with a conductor. Alternatively, preformed physical conductors may be imbedded in the layer. Vias that go over the edge of a layer(s) can be formed by physically placing a wire (round or flat), or array of wires, and wire bonding the ends to the surfaces to be interconnected. Alternatively they can be formed in place by plating or other fabrication process for thick or thin film conductors.

A core layer may also be included in this structure. This layer typically serves as a substrate for the assembly and processing of the ceramic material. The core layer acts to; eliminate horizontal shrinkage, establish a single coefficient of expansion for the multilayer system, and provide mechanical ruggedness to the multilayer assembly. If the layer is a good electrical conductor it may also provide RF shielding. If the layer is also a good thermal conductor, it contributes to the thermal management of the display. Conductive layers, however, present a special problem for via connections. Via connections through metal layers can be fabricated in several ways: filling the periphery of the hole with an insulating material before putting a metal conductor through the middle, or by putting the conductor only through the middle leaving space separating the conductor from the conductive metal core.

The electronics that form the image processing and pixel driving circuitry are mounted on the layers. Electronics are used in the broadest sense to include both active and passive, and both discrete devices mounted on the layers and devices formed in place by processes such as those now used to make active matrix circuits for displays on various high temperature substrates. While these electronics can be placed anywhere, the most convenient location is the back surface. This permits standard assembly and attachment equipment and processes to be used. In addition, the placing of active or passive devices on the intervening layers or viewer surface permits greater flexibility in the system design.

The display material is applied to the surface visible to the viewer. Because of the flexibility of the construction of the disclosed structure, different display materials can be used. In an exemplary structure the display material is covered by a transparent layer to protect and contain the display material. Though this layer may be the transparent electrodes, it is often desirable to couple an additional, substantially flat layer of transparent material, such as glass, over the electrodes and display material.

The edges of the tiles are desirably carefully formed to ensure that the tiled display has no visible seams between the tiles. One criterion for the tiles is that the spacing between the pixels separated by the tile seam is the same as the spacing of pixels on the tile. To satisfy this criterion, the tile edges are desirably dimensionally precise. Furthermore, if the edges are also used for conductors or if mullions are used to join adjacent tiles, it is desirable to account for the thickness of these conductors or mullions in the design and placement of the tiles.

The display tiles may be physically mounted to form a display by coupling the tiles to a transparent front panel. The mounting of the tiles is done such that there is continuity in the pixel spacing over the display. The shape of the tiles is most typically square or rectangular, however the shape can be any shape that can be tiled to form a larger display. Also, the tile is typically flat, but may be curved along one or both dimensions to form curved or domed displays. Curved or domed displays can also be made using flat tiles mounted on a curved or domed front panel. Tiles may be attached to the front panel by numerous means. Several exemplary methods are described below with regard to FIGS. 4–11A.

Different types of tiles may be attached to different areas of the display—for example, higher resolution areas may be placed in the center or other areas of the large display. In addition, different sized or different shaped tiles may be combined in a single display. For example, tiles near the edges of a large panel may be larger and have a lesser pixel density than tiles near the center of the panel.

Alternatively a back panel may be provided for the physical mounting and interconnection of the tiles to form a display. Again the mounting of the tiles is done such that there is continuity in the pixel spacing over the display. Curved or domed displays can also be made using flat tiles mounted on a curved or domed back panel. Tiles may be attached to the back panel either by permanent connection such as soldering or using connectors which allow the tiles to be plugged into the back panel. This latter method permits the repair and replacement of individual tiles.

Even if a back panel is not used to for physical mounting of the display tiles, the back panel may be used to provide the means for connecting the tiles to the operational power and data signals needed to operate the tile. Matching connectors may be provided on both the back side of the tile and the back panel to provide this connection. In the case of the data signal connections, optical connection may be used as an alternative to physical connection.

The electrical structure of the back panel provides for the distribution of power and signals to the tiles, and the electrical structure of the tiles provide for the addressing of the display pixels. Both levels of structure are described. The information needs of a tiled display increase with the size of the display as measured in total number of pixels. A greater number of pixels on a tile translates to greater amounts of data stored on the tile and greater rates of information transfer.

One advantage of the tiled display is that the scan electronics can be internal to the tile and the scan rate of any one tile may be the same for a small display or for a large display. This ensures that the brightness and gray scale of the display do not degrade with increasing size. The tiled displays described in detail below have an architecture which connects the signals to the pixels without interrupting the continuity of the pixel spacing, even at the edges of the tiles. The disclosed tiled displays may also have signal processing circuitry which extracts the signal information for that tile from a broadcast information signal and transforms the extracted information into the signals needed to address that tile.

In general, the front-to-back connections include at least one for each row of pixels and at least one for each column of pixels on the tile. Tiled displays have relatively few pixels so that the number of interconnects per tile is relatively small and the yield on individual tiles can be high. This is a significant advantage of tiled displays when compared to fabrication of large displays from single substrates. In general, the yield is a function of the number of pixels in the display device. The redundancy provided by adding more than one connection per row or column may further increase yield and reliability, and may also reduce line impedance for the rows and columns.

The connection to the row or column is made with a via that extends from the back surface of the tile. This via has a diameter less than the spacing of a pixel. To accomplish this, the portions of the vias in the display layer(s) may be made smaller than the vias through the other intervening layers, and, as described below, the connections may be staggered over the area of the tile to provide maximum spacing between the wider interconnects. These connections are a link in the distribution of the display signals to the pixels.

Figure 2:
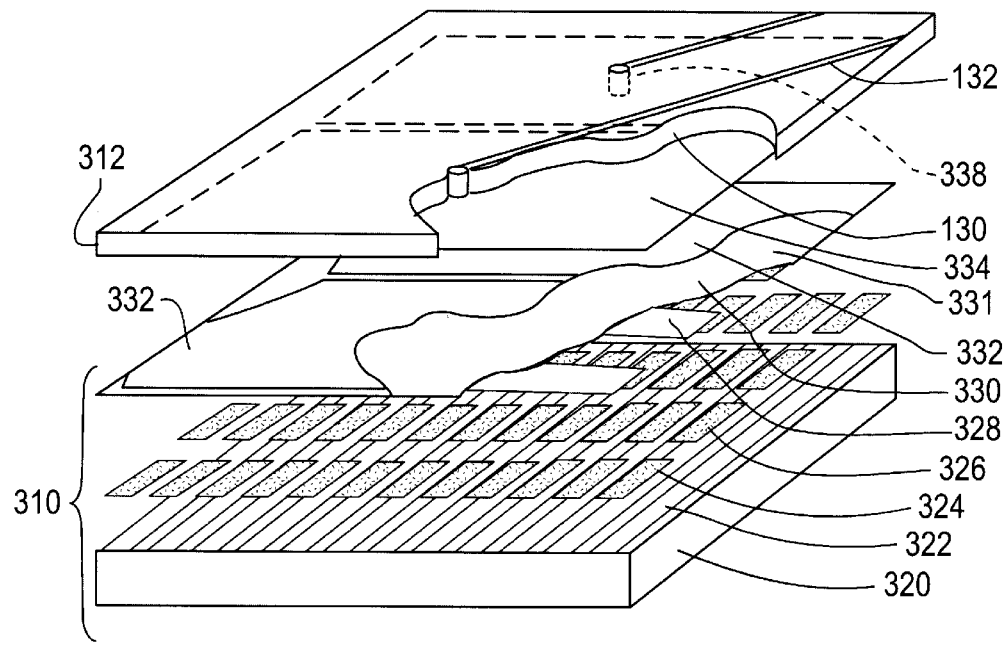
FIG. 2 is an exploded perspective view of an exemplary display tile.

FIG. 2 is an exploded perspective diagram that shows a first exemplary tile structure. The tile structure is formed in two parts: the display section and the electronics section.

The display section includes a transparent front plate which may be, for example, a glass plate. Transparent column electrodes 322 are formed on the front plate 320 by forming thin bands of a transparent conductor, such as indium-tin oxide, using well known processes. This may be done, for example, by depositing a film of ITO over the surface of the glass plate and selectively etching the ITO to form the electrodes. The display materials, red, green and blue OLED materials 324 and 326, including a hole transport layer, a light emitting layer and an electron injecting layer, are deposited on top of the column electrodes to define the active area of the pixel. The hole-transport layer is electrically coupled to the column electrodes, and the light emitting layer is electrically coupled to the hole-transport layer. The electron-injecting layer which may, for example, be formed from metallic calcium is formed on top of the light emitting layer. The row electrodes 328 are formed on top of the electron-injecting layer. It is desirable for the display materials 324 and 326 to occupy only a portion (e.g. about 25 percent) of the pixel area. The row electrodes may be formed, for example, from polysilicon or from a metal such as aluminum using standard deposition techniques. An insulating layer 330 is formed on top of the row electrodes. The exemplary insulating layer 330 may be formed from any of a number of insulating materials. To protect the display materials, the insulating layer 330 is desirably formed using low-temperature processes. Exemplary materials include Polyimide or other low-temperature insulating materials. The insulating layer 330 may be applied using thick film or thin film deposition techniques. The insulating layer 330 includes a plurality of openings 331 aligned with the row electrodes 328 or column electrodes 322.

On top of the insulating layer are deposited a plurality of connecting plates 332. The plates 332 may be formed using, for example, vapor deposited aluminum or a metallic ink or paste, such as silver combined with a solvent, which is deposited using thick film processes. The connecting plates are coupled to the column electrodes 322 and row electrodes 328 by vias which extend through the openings in the insulating materials. Each of the exemplary connecting plates makes electrical contact with only one row electrode or one column electrode. To ensure that a good connection is made, however, each connecting plate 332 may connect to its corresponding row or column electrode at several locations.

The electronics section 312 includes image processing and display driving circuitry (not shown in FIG. 2) a circuit board 130, which may be, for example, a thin sheet of alumina ($Al_2O_3$), deposited electrical conductors 132, connecting pads 334 and vias 338 which electrically connect the conductors 132 to the connecting pads 334 through the circuit board 130. The conductors 132, vias 338 and connecting pads 334 may all be formed using thick film deposition processes to apply a metallic ink or paste. The connecting pads 334 may also be formed from vapor-deposited aluminum. There is a one-to-one relationship between the connecting pads 334 of the electronics section and the connecting plates 322 of the display section. In the exemplary embodiment of the invention, the connecting pads 334 and the connecting plates 322 are electrically connected by bump bonding the display section to the electronics section, using solder balls. Alternatively electrical connection may be formed with an anisotropically conductive adhesive applied between the display section and the electronics section. The combined display section and electronics section forms a tile 120.

It is contemplated, however, that other methods may be used to electrically connect the connecting pads to their respective connecting plates. For example, the connecting plates 322 and connecting pads 334 may be made from a deformable material and patterned to include a portion which extends above the plane of the pad or plate. When the electronics section is mated to the display section, the patterned material on the connecting plates 322 and connecting pads 334 comes into contact and deforms, forming an electrical connection between the corresponding connecting pads and plates. The pads 334 and plates 322 may also be connected by bump-bonding techniques or using wires that are implanted in one of the pads 334 or plates 322 and engage the plate 322 or pad 334 when the electronics section 312 is mated to its corresponding display section 310.

Other tile configurations are contemplated by the subject invention. One desirable configuration is a tile that extends the full length (height) of the display and has a width of, for example, 32 columns. A tile having this shape would require only horizontal (vertical) alignment. In addition, the connecting plates and connecting pads may be made to cover many more columns than rows, providing many more locations at which to make connections to the column electrodes than if the connecting plates and connecting pads were approximately square. It is also contemplated that a display may be formed from different shaped tiles, for example long tiles that span the entire height of the display on the sides and smaller, square tiles near the center of the display. The different tiles may also employ different pixel pitches such that the tiles on the sides of the display may have a relatively, large pixel pitch while the tiles near the center of the display have a relatively small pixel pitch.

Furthermore, although the exemplary embodiments of the invention show the electronics sections of the tiles being the same size as the display sections, it is contemplated that these may be different sizes. For example, a single electronics section (not shown) may be as large as two contiguous display sections (not shown). When assembled, two display sections would be aligned with and bonded to the single electronics section. A structure of this sort would still be referred to as a single video tile of the present invention. In another contemplated configuration, an electronics section is formed which spans the entire display device and individual display sections are mounted onto the electronics section. In this configuration, the electronics section may include multiple electronics modules 132, but would still be a single video tile.

It is also contemplated that the electronics sections may be smaller than the display sections. Thus, an entire display may consist of a single display section (not shown) that is bonded to multiple electronics sections (not shown). As in the previous case, this would still be a single video tile of the present invention. It may be desirable to manufacture the display sections and the electronics sections in different sizes to maximize yield of both components. The assembly of multiple display sections onto a single electronics section should align the pixels such that no seam is visible between contiguous display sections.

FIGS. 4 through 11A illustrate another exemplary method by which tiles 120 may be joined to form a composite tiled display 100. By definition, there is a physical gap between the tiles in a tiled display. It is desirable to make this physical gap invisible to the viewer. Invisible in this context means that light emitted by the pixels that may be scattered or refracted at the gap should not be seen by a viewer, and that no external line-of-sight exists which would enable a viewer to detect the physical gap.

State-of-the-art tiled displays using CRTs or projection displays use a mullion between the individual displays to hide the physical gap, however, these mullions are visible to the observer and are also objectionable to the viewer because they break the continuity of the image. It is, therefore, desirable that any structure used to make the gap invisible does not break the continuity of the larger image.

Another structure commonly found in both tiled and non-tiled displays is a black matrix. A black matrix may be fabricated from black lines. The black matrix is put between the active portions of the pixels to absorb ambient light in these areas in order to increase the display contrast. Black matrix lines may be found, for example between the phosphors on the front screen of a CRT or between the pixel positions defined for a liquid crystal display. In tiled displays, black matrix lines are typically smaller than mullions and are typically placed in the plane of the pixels. Because the black matrix lines are periodic and placed between the pixels, they do not tend to break the continuity of the image. The black matrix mask has many advantages in a tiled display system and the embodiments as described below contain black matrix mask, but it is contemplated that the tiled display systems and modular repair methods described below may be practiced without such a structure.

An embodiment of the present invention employs an optical structure that may be incorporated in a tiled display to make the physical gaps between the tiles indistinguishable from the black matrix and, thus, invisible to the viewer. An illustration of this structure is shown in FIGS. 11 and 11A. FIG. 11 is a cut-away perspective drawing of a partially assembled display device. FIG. 11A shows details of a portion of the display device shown in FIG. 11. The main components of the structure shown in FIG. 11 are a frame 2014, a transparent sheet 2020 of, for example, glass or plastic, a plurality of black lines 2010 that form a black matrix and the tiles 120 which form the display. An important feature of the optical integrator structure is a pattern of black lines 2010 which are like black matrix lines in that they have equal widths and spacing equal to the pixel pitch. These black lines 2010 may be aligned to lie between all pixels in the display, including those pixels on either side of the gaps 2012 between the tiles 120. The optical integrator pattern of black lines are also like mullions in that some of the black lines in the optical integrator structure lie on top of the gaps between the display tiles and block their visibility. As assembled, the glass substrates 320 of the tiles 120 are positioned adjacent to the black lines 2010 on the back surface of the transparent sheet 2020, which forms the integrating structure.

Unlike a conventional black matrix, the disclosed optical structure for integrating display tiles is placed above the plane containing the pixels (like mullion structures), on the viewer-side of the tiles 120, with the black line pattern being in contact with the display tiles. Unlike mullions, the black lines on the optical integrator structure 2020 are relatively narrow, so that the black lines that cover the mullions are essentially the same width as the black lines which form the black matrix. Thus the disclosed structure simultaneously provides the functions of the black matrix and the mullions, but the mullion lines are not visible, as such, to the viewer because all lines in the pattern on the optical integrator structure 2020 are essentially the same and are virtually indistinguishable. Accordingly, the viewer simply sees a uniform pattern of black lines. A key feature of this aspect of the present invention is the precise specification of the pattern of black lines and mullions on the disclosed optical integrator structure so that the physical gaps between tiles are hidden from the viewer, and at the same time little or no emitted light is blocked from exiting the display. In addition, the black matrix and the mullions do not disturb the continuity of the larger image, even across the gaps between tiles.

Figure 3:
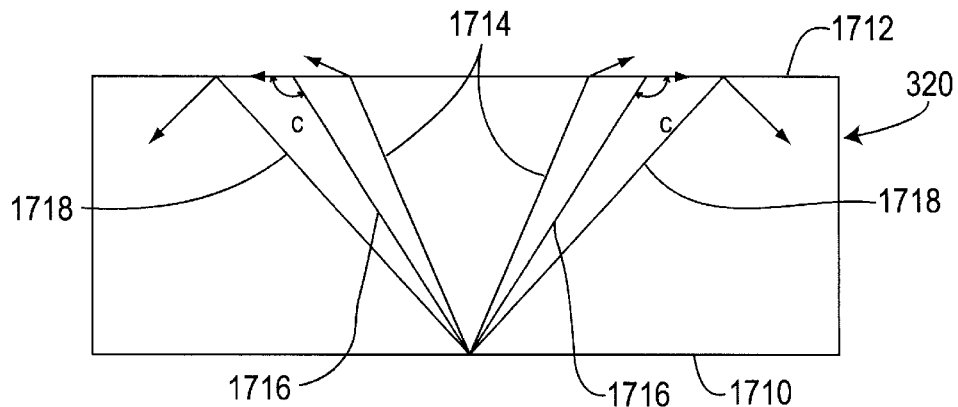
FIG. 3 is a cut-away side plan view of the glass plate of a pixel of a tile which is useful for describing a method for forming a black matrix for the display.

To determine the optimum placement for a black stripe or a mullion on the front surface of the glass substrate of an emissive display, it is helpful to understand the properties of light emitted by the display. FIG. 3 shows a cross section of an exemplary glass substrate 320 that includes a bottom surface 1710 and a top surface 1712. A number of representative optical rays, 1714, 1716 and 1718 are shown emanating from a point on the lo bottom surface 1710. Some rays 1714 exit the glass and some rays 1718 are totally internally reflected from the top surface and are trapped in the sheet of glass. At the transition between these two types of rays are rays 1716 which are refracted to an angle parallel to the top surface 1712 of the substrate 320.

The angle of incidence of the rays 1716 which are at the transition is called the critical angle ($\theta_c$). Light reaching the surface 1712 with angles less than the critical angle exits the glass, and light reaching the surface 1712 with angles larger that the critical angle are totally internally reflected. The critical angle is dependent on the index of refraction, $n_{glass}$, of the glass substrate 320 as shown in equation (1):

$$\theta_c = \mathrm{Sin}^{-1}(1/n_{glass}) \quad (1)$$

In the exemplary embodiment of the invention, $n_{glass}$=1.55 and $\theta_c$~40°.

A tiled display is made of tiles that are placed in an array so that the spacing between pixels across the gap between tiles is substantially the same as the pitch between pixels within the display tiles. Thus, the display tile edge is one half pitch distance (or slightly less) from the center of the last pixel. Because of the critical angle, light emitted from a point within a sheet of glass can travel at most a lateral distance of $d_c = t_{glass} \mathrm{Tan}(\theta_c)$, where $t_{glass}$ is the thickness of glass. Therefore, light from any part of a gap region may be blocked by putting a black stripe of width $W_m$.>$2d_c$ over the gap region. Such a black stripe may be the top of the mullion 1512. Because of the symmetry of optics, the same black stripe blocks any external rays from making the gap region visible. Thus this black stripe makes the gap region invisible to an observer. In practice, the black stripe may need to be slightly wider than $2d_c$ to fully block lines of sight to the gap on account of the finite width of the gap. A similar analysis may be used to determine the appropriate parameters in the embodiment illustrated in FIG. 5 in which the black matrix mask is formed on the outer surface of the front panel.

Referring, again, to the structure shown in FIGS. 11 and 11A, the individual tiles do not need to be joined by discrete mullions. Instead, the tiles may be assembled directly on the back surface of the optical integrating structure 2020 such that the gaps are positioned directly over black stripes having a width $W_m$. As shown in FIGS. 11 and 11A, the exemplary optical integrating structure 2020 is positioned on top of the array of tiles, with the black lines on the surface of the structure in contact with the glass substrates 320 of tiles. The centers of the black lines are aligned with the gaps between the tiles so that the gap regions can not be seen by an observer. Although this embodiment of the invention does not need discrete mullions, if the tiles are connected by mullions 1512, the integrating structure 2020 may include black lines that cover the crossbars 1610 of the mullions. In this instance it would be desirable for the crossbar of the mullion to be as narrow as possible to minimize any gap between the top surface of the tile 120 and the back surface of the integrating structure 2020. Alternatively, the mullions 1512 may be assembled onto the integrating structure 2020 with the black matrix lines. In this configuration, the mullions form pockets into which tiles 120 are inserted to form the composite display. This structure may be formed by attaching the mullions directly to the integrating structure 2020 using an adhesive and then applying an adhesive to the undersides of the crossbars 1610 and to the sides of the stems 1008 before inserting a tile into the display.

The black lines on the optical integrating structure 2020 that form the mullions which are used to cover the inter-tile gap tend to be wider than the typical black matrix line and may block some or all of the light emitted from the pixels near the edge of the tile. To allow the maximum amount of light to pass and yet avoid any artifact distortion in the assembled display device, the display tiles and the black stripes on the integrating structure 2020 are desirably specifically designed to have particular relationships.

Figure 4:
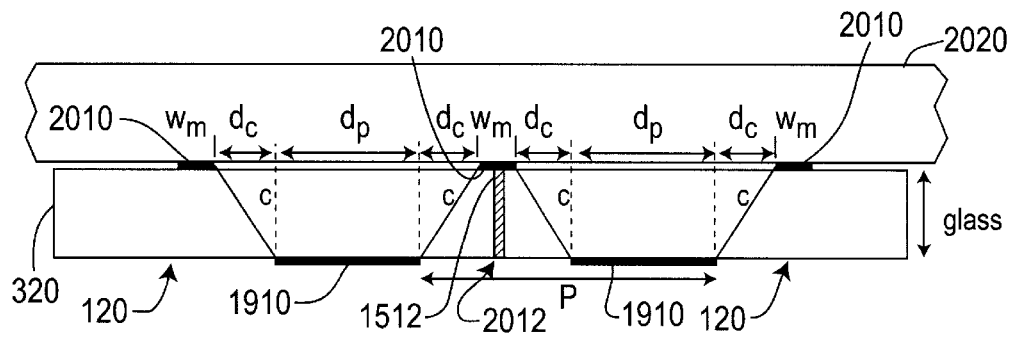
FIG. 4 is a cut-away side plan view of a portion of the glass plates of two adjacent tiles and the front panel which is useful for describing a method for forming a black matrix including mullions for the display.

FIG. 4 shows a cross section of a pixel that includes two pixel regions. The emissive regions 1910 at the bottom of the glass substrate 320 have a width $d_p$. The light rays that can exit the glass section and are useful for viewing, exit the top of the glass 320 in an area having a width $w = 2d_c + d_p$. A display tile has an array of pixels equally spaced a distance known as P, the pixel pitch. Therefore, to not block any viewable light, it is desirable for the black matrix to have a width, $W_m < P - d_p - 2d_c$. The dimensions illustrated in FIGS. 4–9 depict cases where a stripe of the black matrix mask completely hides the gap and yet, blocks no emitted light.

As described above, in the exemplary embodiment of the invention, the pixels on the tiles have an aperture of approximately 25% in order to allow room within the pixel for a via to make electrical contact with a column electrode. Thus, in the exemplary embodiment of the invention, $d_p$ is approximately P/2. This relatively small aperture also has advantages by making it easier to hide the inter-tile gap and allowing a relatively large-stripe black matrix to improve the contrast of the display.

There are two width criteria to be met by the black stripes that form the black matrix, and the top bar of the mullions: $W_m > 2d_c$ (to hide the gap), and $W_m < P - d_p - 2d_c$ (to avoid blocking light from the pixels). The most desirable solution is the design point with the largest glass thickness, where both criteria are met. That design point is met when the thickness of the glass is 0.15 times P, the pixel pitch, and the width of the black stripe is 0.25 times the pixel pitch. Designing the display tile and black matrix stripes to meet that condition results in making a large area display by integrating individual tiles behind the optical integrating structure having inter-tile gaps that cannot be seen. It has been found that the portion of the gap most often detected is the edge of the top surface of the glass substrate of the tile, particularly is if the stem of the mullion is either clear or reflective. Therefore, $W_m$ may be smaller or the $t_{glass}$ may be greater without significantly increasing the visibility of the gaps.

Figure 5:
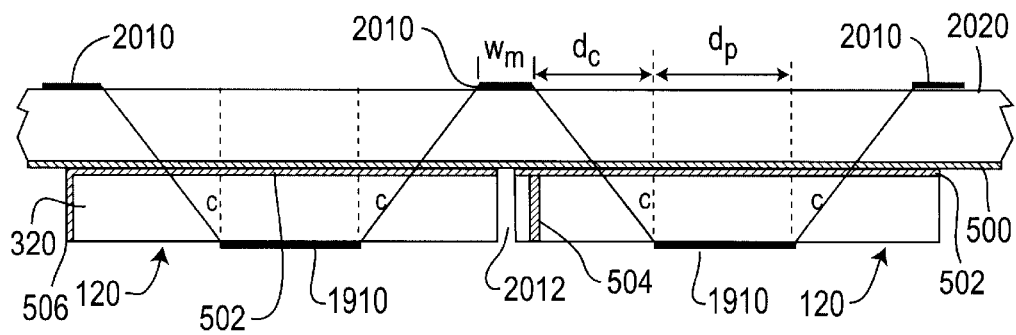
FIG. 5 is a cut-away side plan view of a portion of the glass plates of two adjacent tiles and the front panel which is useful for describing an alternate method for forming a black matrix for the display. Two methods of including a heating element in a video tile are also illustrated.

In the embodiment illustrated by FIG. 5 the calculation of $d_c$ is more complicated because the light passes through three transparent layers between the emmissive pixel material 1910 and the black matrix 2010. Although it may be desirable to match their indices of refraction, these three layers may have three different indices of refraction. Desirably, the adhesive layer 500 is negligibly thin, leaving only the thicknesses of the glass substrate 320 and the transparent front panel 2020 to consider. In this embodiment it may be desirable for one, or both, of these layers to have a relatively high index of refraction to allow for greater thickness. It may also be desirable for the aperture $d_p$ of the emissive region to be slightly smaller in this embodiment.

When the thickness of the glass substrate 320 and the width of the black stripe satisfy the criteria described above, no light that is directed toward a viewer directly in front of the display (e.g. viewing from a normal angle) is blocked, and no light from greater viewing angles is blocked. When the thickness of the glass substrate 320 and/or the width of the black stripe are greater than the criteria described above, no light that is directed toward a viewer directly in front of the display (e.g. viewing from a normal angle) is blocked, but some light from greater viewing angles may be blocked.

As mentioned above and illustrated in FIGS. 4–11A, the exemplary black matrix masks 2010 offer several advantages in an exemplary display tile of the present invention such as: serving as mullions to hide seams between display tiles (part of the mask pattern may even be formed by a mullion 1512 as shown in FIGS. 4, 6, 7, and 8); improving contrast of the display; and, as shown in FIG. 11A, framing the individual pixels to assist in precise alignment of display tiles within the display system frame.

FIG. 4 shows a cut-away side view an exemplary embodiment of a black matrix mask 2010, which includes a mullion 1512, in a portion of a tiled display system of the present invention. To take full advantage of the black matrix mask 2010 it is desirable to couple the front surfaces of the glass substrates 320 of display tiles 120 to the transparent front panel 2020. When the tiles are coupled to the front panel, the stripes of the black matrix mask are formed of an opaque adhesive which may be cured during assembly. Many adhesives, and curing methods, are well known which may be employed in this embodiment.

If the tiled display is constructed so that the modular repair method of the present invention may be employed, the adhesive should be of a type that may be cured to provide a secure bond and later unbonded to release the tile unharmed. This exemplary embodiment, and those illustrated in FIGS. 5–10, are described in terms of a heat-activated adhesive, such as an acrylic or polystyrene thermoplastic. It is desirable that this heat-activated adhesive layer have a softening point above the operating temperature of the video display tile and below the damage threshold temperature of the video display tile.

In an exemplary embodiment of present invention, these temperatures are 80 degrees centigrade and 150 degrees centigrade respectively. The softening point of both acrylic and polystyrene adhesives may be set by picking the proper molecular weight for the thermoplastic adhesive used. It will be understood to one skilled in the art that either of these materials may be used in the present invention, as well as a number of other adhesive materials.

An additional issue with large-area displays in general, which is of particular importance in a tiled display system employing a heat-activated adhesive, is the thermal expansion coefficient differences between the components of the tiled display. With regard to the tiles themselves, this issue has been addressed in two different ways in two different exemplary embodiments of tile construction which may be used in the system and methods of the present invention.

With regard to the exemplary embodiment in which the electronics section and the display section are formed separately and then bonded together, the use of solder bumps to electrically connect the two sections combined with a non-brittle adhesive for mechanical connection has been described in U.S. patent application Ser. No. 09/250,329 as a method to avoid problems arising from possible differences in the thermal expansion coefficient of the two sections.

In a co-pending US Patent Application entitiled DISPLAY TILE STRUCTURE USING ORGANIC LIGHT EMITTING MATERIALS and filed on an even date herewith, an exemplary tile embodiment is described in which the tile is formed on a single substrate. One of the advantages of this exemplary tile embodiment is that the single substrate can encourage a single thermal expansion coefficient in the tile.

The tiled display system of the present invention has two addition issues relating to thermal expansion. Because the tiles are bonded directly to the front display panel it is important that the display section of the tile and the front panel have substantially the same thermal expansion coefficient. As in the case of the tiles constructed in two sections, some thermal expansion mismatch can be absorbed by a non-brittle adhesive layer, but this can lead to the build up of strain or possible misalignment of pixels and the black matrix mask. Therefore it is desirable to keep the thermal expansion coefficients as close as possible. For this reason, an exemplary embodiment of the present invention uses glass for both the glass substrate 320 of the tile and the transparent front panel 2020.

Additionally in many of the exemplary modular repair methods of the present invention it is desirable to only unbond the defective tile from the display, without loosening its neighbors. When the tiles are bonded to the front panel with a heat-activated adhesive, this may mean selectively heating a small portion of the front panel. In this case it is desirable that the front panel be constructed of a transparent material which is largely immune to damage from thermal shock. Two such materials are borosilicate glass, which has a small thermal expansion coefficient, and polycarbonate, which has a enough elasticity to make up for having a larger thermal expansion coefficient.

FIG. 5 illustrates a cut-away side view of another exemplary video display system of the present invention. Two video display tiles 120 are shown coupled to the transparent front display panel 2020 using a transparent adhesive 500, which is spread over the inside surface of the transparent front display panel. Adhesive 500 is desirably a heat activated adhesive, such as a thermoplastic adhesive. Alternatively, adhesive 500 may be another transparent adhesive, such as a UV-cured epoxy or an elastomeric adhesive compound. An exemplary embodiment of the present invention may use an elastomeric adhesive, not only to couple the video display tiles to the transparent front panel, but also to pot the entire tile, leaving only connectors for power and signals exposed.

FIG. 5 also shows a front surface heating element 502 on each of the display tiles. This heating element, which may be, for example, a simple resistive heating element, may be used to soften the adhesive, both for original assembly of the video display system, and for modular repair of defective tiles. In this exemplary embodiment of the present invention, each tile includes a heating element, or an array of heating elements, that allow an operator to selectively soften and release the adhesive for one tile at a time, thereby aiding in the modular repair of a defective tile.

The two tiles illustrated in FIG. 5 are shown with separate exemplary embodiments of the heating element structure. In one tile, via 504 is used to provide electrical connectivity to the heating element, while in the other tile structure, an edge electrode 506 is use to provide this connectivity. One or both of these methods may be used to connect the heating elements to the circuit board layer in an exemplary video tile with integral tile heating of the present invention. Alternatively, the heating elements may be adapted to be preferentially heated by energy absorbed from an external electromagnetic radiation source, such as microwaves.

Another feature illustrated in FIG. 5 is an alternate embodiment of the black matrix mask 2010, used to hide seams between video display tiles 2012. In this embodiment, the mask has been placed on the outer surface of the front transparent display panel, rather than on the inner surface. This placement of the black mask insures that it will not be damaged during modular repair of a display tile.

Figure 6:
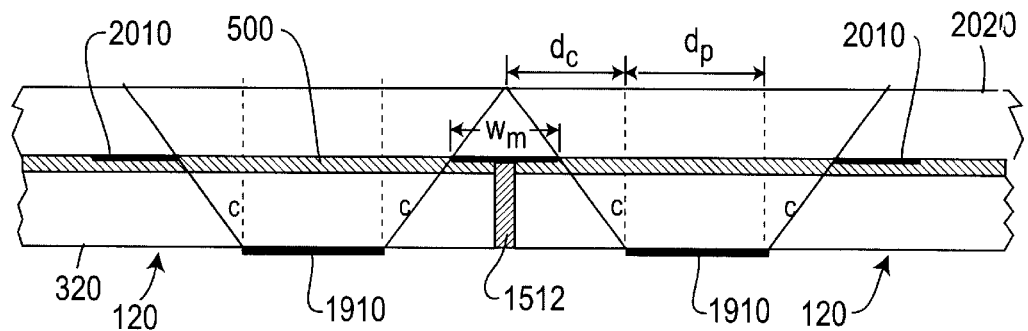
FIG. 6 is a cut-away side plan view of a portion of the glass plates of two adjacent tiles and the front panel which is useful for describing a method of modular display repair.

FIG. 6 illustrates another embodiment of the video display structure of the present invention. In this embodiment, two display tiles 120 are coupled to the transparent front panel 2020 by a transparent adhesive layer 500. Once again in this embodiment the transparent adhesive layer is spread over the entire top surface of the transparent front plate 320 of the video tiles. In this embodiment of the present invention the black matrix mask is 210 is formed on the inside surface of the transparent front panel. A mullion 1512 is shown between the two video tiles in FIG. 6 and is illustrated as providing a portion of the black matrix mask. An advantage of this embodiment is that the mullion may provide additional assistance in aligning the video tiles to the black matrix mask. It is contemplated that this embodiment may be practiced with a stripe of the black matrix mask replacing the mullion.

Figure 7:
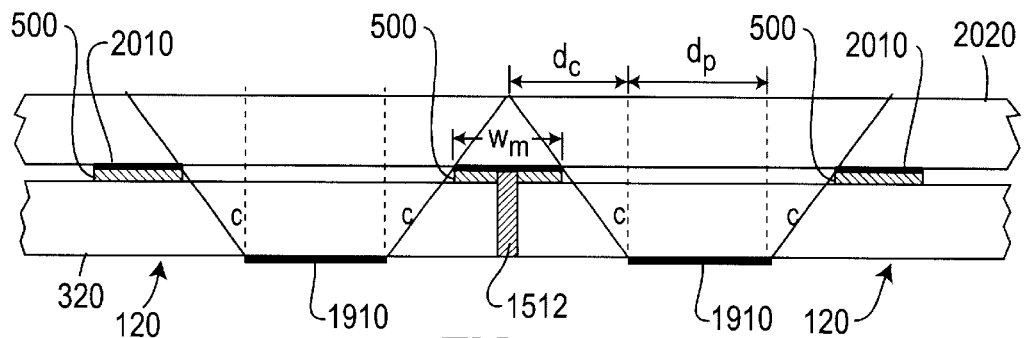
FIG. 7 is a cut-away side plan view of a portion of the glass plates of two adjacent tiles and the front panel which is useful for describing an alternate method of modular display repair.

FIG. 7 is a cut-away side view that illustrates yet another embodiment of the present invention. Once again in this embodiment, video tiles 120 are coupled to the transparent front panel of the video display unit with adhesive 500. In this embodiment, the adhesive may be non-transparent, as the adhesive is applied only in regions covered by the black matrix mask 2010. This embodiment may provide additional advantages beyond the increased number of adhesives that may be used. For example, this embodiment of adhesive placement in a video display tile system may provide for the more easily controlled heating of the adhesive during original assembly, or modular repair of defective video tiles.

Figure 9:
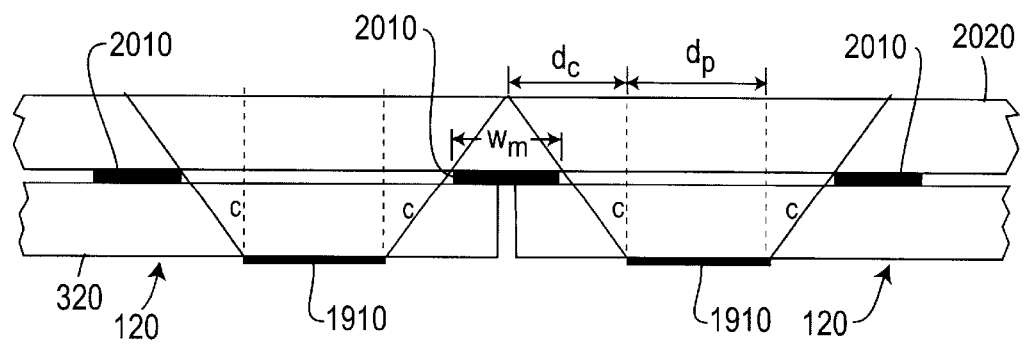
FIG. 9 is a cut-away side plan view of a portion of the glass plates of two adjacent tiles and the front panel which is useful for describing an alternate method of modular display repair.

In this embodiment, as well as those shown in FIGS. 4 and 9, the adhesive may be softened by heating only the black matrix mask. One method to accomplish this is to use an infrared or other light source. Such an energy source is preferentially absorbed by the high absorptivity material used to construct the black matrix mask, providing efficient localization of the heat applied to the display. Also, the region to be heated may be easily masked off to only one video tile. Therefore, the use of this heating method may provide a means whereby the neighboring tiles are protected from being loosened or misaligned during the softening of the adhesive of the tile under repair. As the embodiments of FIGS. 4, 7, and 9 are well suited to an optical heating method, use of these embodiments may further decrease the likelihood of damaging, or misaligning a video tile during either assembly or modular repair of a neighbor video tile.

Another method that may be used, in the embodiment of FIG. 7, to heat the black mask is to provide resistive heating strips within the body of the black matrix mask stripes. With this method, each strip, horizontal and vertical, may be individually heated. Alternatively, all of the horizontal heating strips associated with a row of tiles may be connected together. Likewise, all of the vertical heating strips associated with a column of tiles may be connected together. This method may also be used to release only one tile by heating all of the horizontal and vertical heating strips associated with one tile. Other tiles will have the adhesive under either their horizontal or their vertical stripes softened, but will not be completely loosened.

Figure 8:
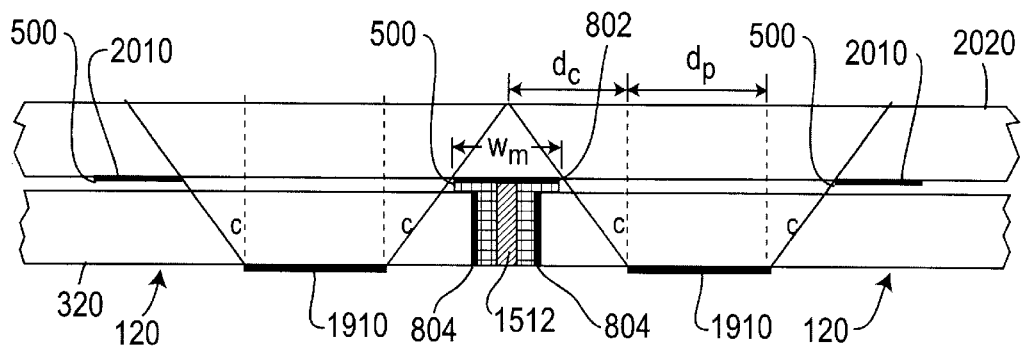
FIG. 8 is a cut-away side plan view of a portion of the glass plates of two adjacent tiles and the front panel which is useful for describing an alternate method of modular display repair. A method of including a heating element in a video tile is also illustrated.

FIG. 8 is a cut-away side view of another exemplary embodiment of a video display system according to the present invention. In this embodiment the adhesive 500 is used to couple the video tiles 120 to mullions 1512 which are formed between the video tiles. The mullions are attached to the transparent front panel 2020 by a second adhesive 802. The second adhesive is desirably chosen to have a higher softening point than the adhesive 500, thus preventing the mullion from loosening when adhesive 500 is softened during assembly or modular tile repair. As in FIG. 7, adhesive 500 may be a non-transparent adhesive in this embodiment.

This embodiment differs from the embodiments shown in FIGS. 4–7 in that the thermally softened adhesive may be activated by heaters which are disposed in the mullions, shown in FIG. 10, or by the mullions themselves, if the mullions are formed from an appropriate resistive, or absorptive, material. Alternately, as shown in FIG. 8, adhesive 500 may be heated to its softening point by edge heating elements 804, which are formed along the edges of the video tiles 120 and electrically coupled to the circuit board section of the video tiles.

FIG. 9 shows a further exemplary embodiment of the present invention. In this embodiment, as in the embodiment of FIG. 4, the black matrix mask 2010 is itself desirably a non-transparent heat activated adhesive that is used to couple the video tiles 120 to the transparent front panel 2020. This embodiment of the present invention provides an advantage similar to that of the embodiment illustrated in FIG. 7, whereby the adhesive may be preferentially softened by an infrared or other light source the energy of which is absorbed by the black matrix mask during either assembly or modular display repair.

FIGS. 10A and 10B illustrate two exemplary mullions 1512, which may be used in an embodiment of the present video display system. FIG. 10A shows an exemplary row mullion which contains an integral upper heating element 1002 that runs the length of the mullion. This heating element may be employed to soften the adhesive 500 used to couple video tiles to a mullion in an exemplary embodiment of the present video display system, such as the embodiment shown in FIG. 8.

FIG. 10B illustrates an exemplary column mullion, containing an integral lower heating element 1004. This heating element also runs the length of the mullion and may be used to soften adhesive used to couple a video tile to a mullion, just as the upper heating element shown in FIG. 10A. It should be understood that the designations of row and column for the exemplary mullions in FIGS. 10A and 10B are arbitrary and only used to provide clarity in these descriptions. These designations may be switched or one type of mullion may be used for both rows and columns.

An embodiment of the present video system is contemplated in which the row mullions of FIG. 10A and the column mullions of FIG. 10B are placed together in a matrix which surrounds each video tile with two row and two column mullions. The upper heating elements 1002 are electrically coupled across an entire row of the mullions in the video display system. Each end of the coupled row of upper heating elements is electrically coupled to the frame of the video display unit. In a similar fashion the lower heating elements 1004 are coupled together along entire columns. One advantage of this exemplary configuration is that it provides a means whereby the entire portion of the adhesive coupling a specific tile to the mullions may be softened, without softening all of the adhesive coupling any other tile to the mullions. This is accomplished by heating two adjacent rows of heating elements and two adjacent columns of heating elements.

The mullion 1512 also includes a crossbar 1006 which may be formed from a black material or may be printed or painted black. To ensure that the mullion does not create artifacts on the display device, it is desirable for the top surface of the mullion to closely match the black stripes in size, color and gloss. The mullion 1512 also includes a bottom stem 1008 that are desirably formed from a reflective material (e.g. white or specular). Alternatively, the bottom stem of the mullion may be transparent and have an index of refraction closely matching that of the glass substrate 320. It is desirable for the bottom stem of the mullion to be reflective or transparent so that any light scattered in the vicinity of the mullion has the same properties as light that is scattered among pixels at the interior of a tile. If light scatters differently at the edge of a tile than near the center then the edge may be visible, for example, as a band of reduced brightness in the displayed image. The stem 1008 and the underside of the crossbar 1006 of the mullion may be coated with adhesive 500 to attach the mullion 1512 to the two tiles which it joins. If the top surface is coated with a second adhesive 802, the mullions may be used to join the tiles into a display device.

Returning again to the optical structure of FIGS. 11 and 11A, it is contemplated that the contrast may be further improved by coating the viewer-side of the integrating structure 2020 with an antireflection coating and/or by adding an ambient light absorber or color filter on that surface in the adhesive or in the bulk of the material (e.g. glass or plastic) from which the optical integrating structure 2020 is constructed.

It is also contemplated that the integrating structure 2020 may include a diffuser coating, or diffractive optics, on the viewer-side surface. This diffuser enlarges the apparent size of the pixels reducing the visibility of the individual pixels and black matrix structure. Thus, a diffuser may act to reduce the visibility of the pixel structure. This may be significant, especially for display devices having relatively large pixels or which have smaller pixels but are designed to be viewed at close proximity to the display device. Another method by which the visibility of the pixel structure may be reduced is to use a quad pixel structure in which spaced single-color sub-pixels form a single color pixel.

The integrating structure 2020 also provides a simple way to align and mount the display tiles. In particular the patterns on the integrating structure 2020 may be accurately aligned with the pixels using, for example moire patterns, to position a tile and then the tile may be mounted onto the structure 2020 with an optically clear adhesive.

Figure 12:
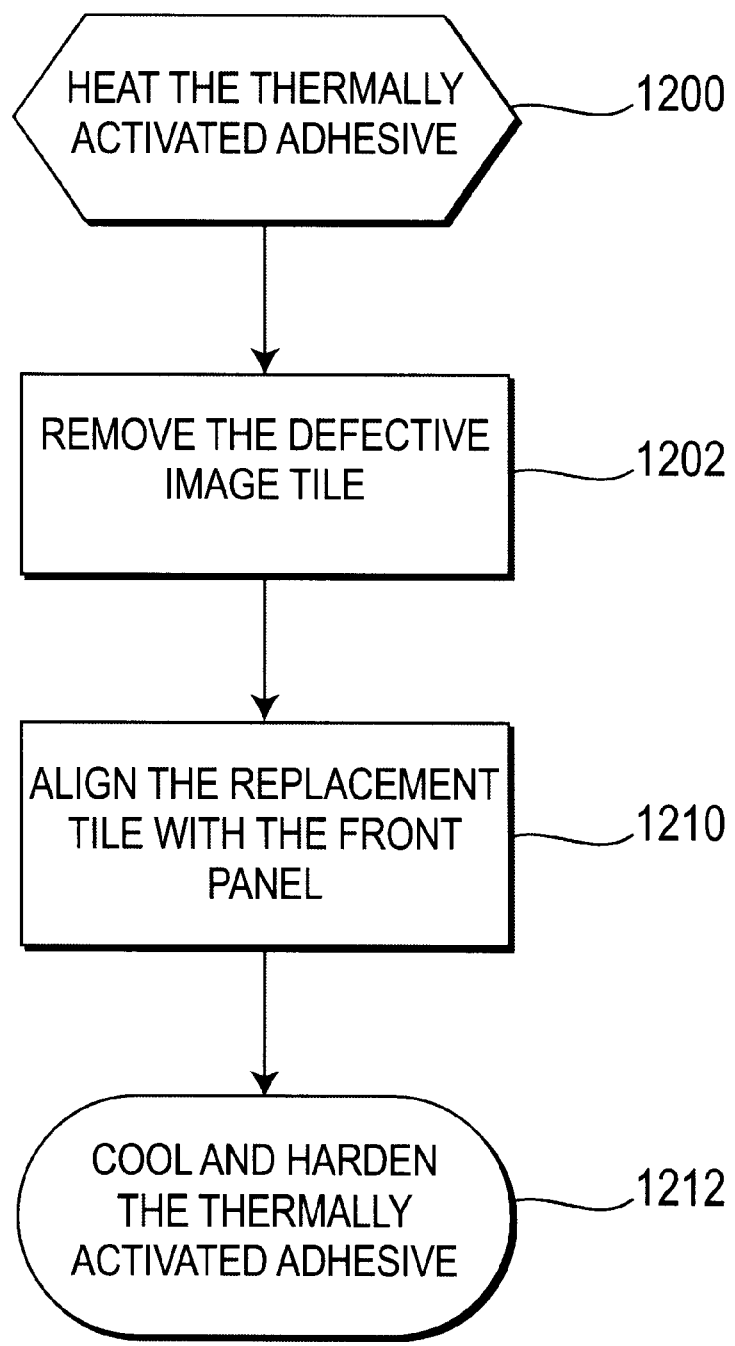
FIG. 12 is a flowchart describing an exemplary modular display repair method.
Figure 13:
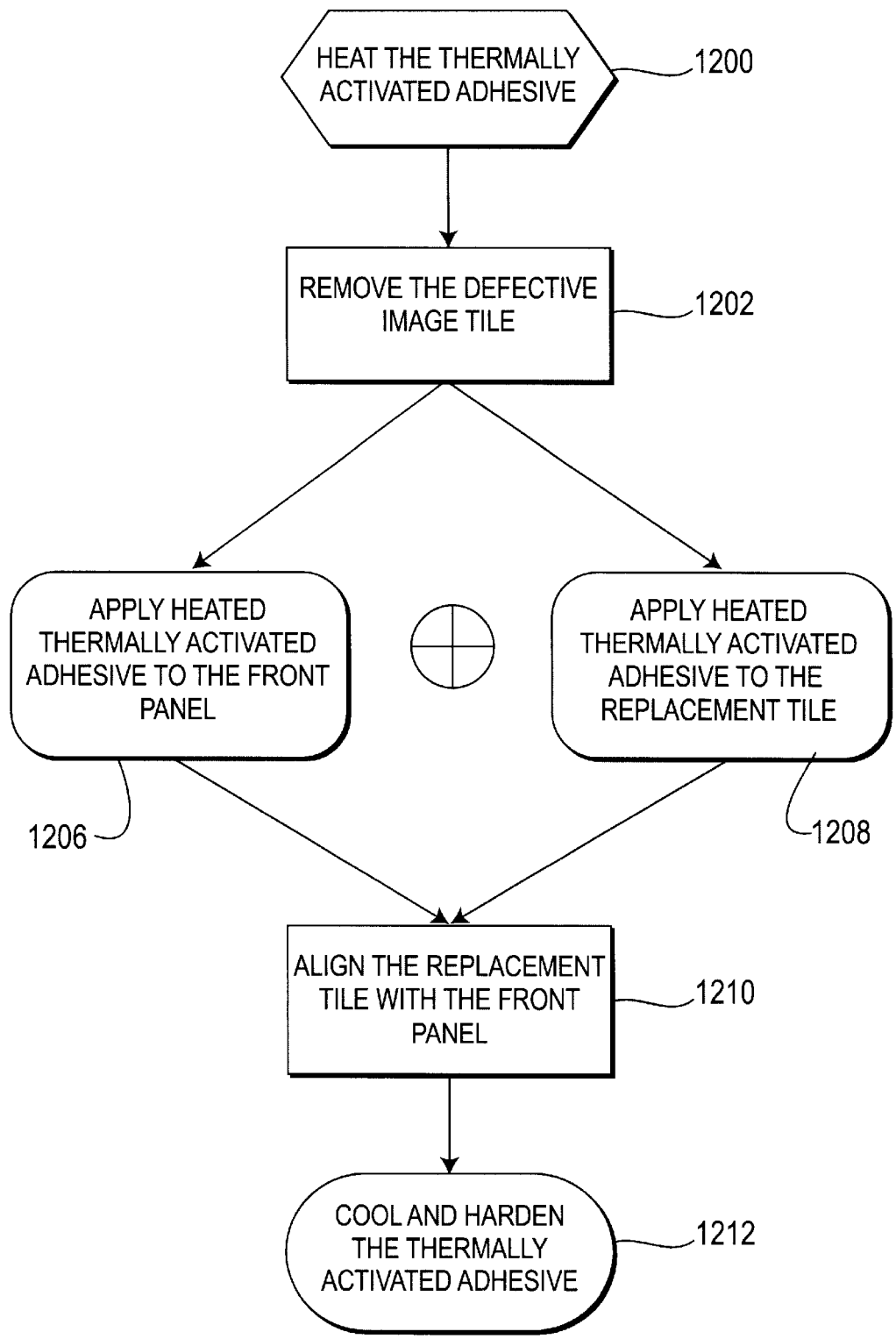
FIG. 13 is a flowchart describing another exemplary modular display repair method.
Figure 14:
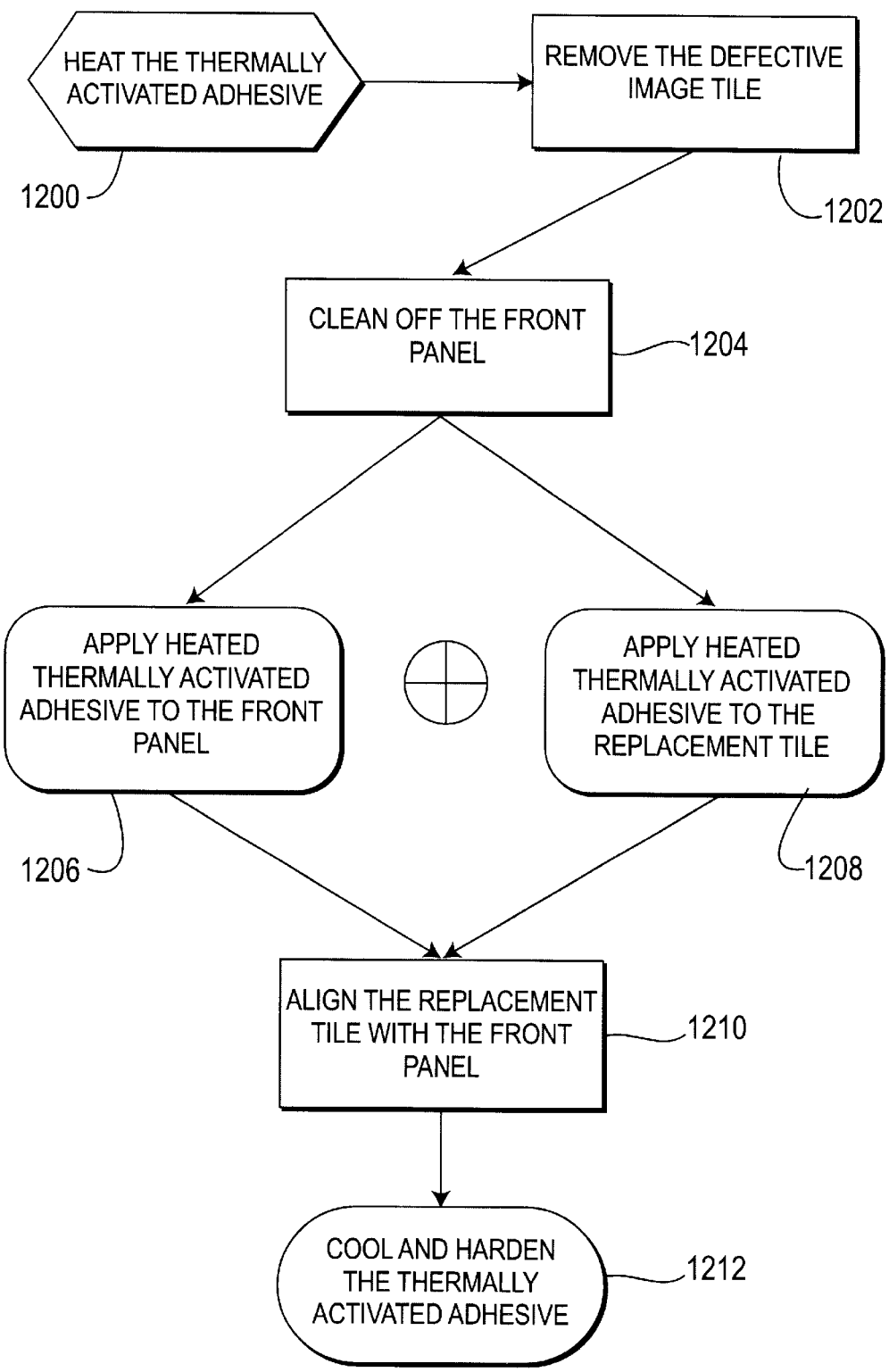
FIG. 14 is a flowchart describing a third exemplary modular display repair method.

As described above many of the embodiments of a tiled display of the present invention contain features that are well suited to the exemplary methods of modular repair shown in FIGS. 12–14. One advantage of tiled display, or detector, systems is modular construction, a exemplary method for which is discussed below with regard to FIG. 15. By constructing a large system from a number of smaller modules, or in the present invention tiles, yield may be increased and, thus, the cost of each piece lost due to defects may be reduced. Modular repair is an important additional advantage that may come from modular design, but not one that has been available in tiled display systems.

The exemplary methods, illustrated in FIGS. 12–14, are described to repair a single defective tile of a tiled display system in which the tiles 120 have been coupled to the transparent front panel 2020 of the display using a heat activated adhesive 500 as described above. It is contemplated that these methods may be used to repair more than one defective tile, with other tiled optical systems, or with other adhesives which may be non-destructively unbonded.

FIG. 12 is a flowchart of steps of an exemplary modular repair method of the present invention. The first step 1200 is to heat the heat activated adhesive to a working temperature which is desirably greater than the softening point of the adhesive and below the damage threshold of the display tiles. Numerous methods may be employed to heat the adhesive, such as heat guns, optical heat sources, microwave sources, electrical heaters, fire, and immersion in hot liquids. Electrical heaters may be resistive, thermocouple or absorptive and external to the display system or internal as described above with regard to FIGS. 5 and 10. Though it is most often desirable to only unbond the adhesive holding the defective tile, this is not necessary. In fact, if the tiles are very closely packed, it may prove desirable to loosen the neighboring tiles during modular repair and then realign them before allowing the adhesive to cure.

Once the adhesive coupling the defective tile has been softened, the defective tile is removed 1202 and replaced with a replacement tile which is carefully aligned to the front panel 1210. The alignment process may be assisted by a black matrix mask 2010, mullions 1512, or a combination of these two, as described above with regard to FIGS. 4–11A. Alternately, the alignment may be based on obtaining the best fit between the replacement tile and its neighbors without any additional assistance. After the desired alignment is achieved the adhesive is cured, i.e. allowed to cool and harden 1212. It should be noted that the adhesive may be allowed to cool between the removal of the defective tile and completion of alignment of the replacement tile, then resoftened.

FIG. 13 is a flowchart illustrating the steps of another exemplary modular repair method of the present invention. The first two steps 1200, heating the adhesive, and 1202, removing the defective tile, of this embodiment are the same as the embodiment described above with regard to FIG. 12. Following these two steps come two new steps: step 1206, applying heat activated adhesive to the front panel, or mullions 1512 if the embodiment of FIG. 8 is used to construct the display; and step 1208, applying heat activated adhesive to the replacement tile. In both step 1206 and step 1208 the adhesive is desirably applied in its softened state. It is contemplated that either of these steps, or both, may be employed. The method of this embodiment then follows the same final two steps 1210, aligning the replacement tile, and 1212, curing the adhesive, as in the method shown in FIG. 12.

FIG. 14 is a flowchart illustrating the steps of a third exemplary modular repair method of the present invention. The first two steps 1200, heating the adhesive, and 1202, removing the defective tile, of this embodiment are once again the same as the embodiments described above with regard to FIGS. 12 and 13. At this point the portion of the front panel uncovered by the removed tile may have any remaining adhesive cleaned off of it, step 1204. This step may be used for several reasons such as providing an even coat of adhesive or providing fresh adhesive. It is contemplated, though, that this step may be unnecessary or in some cases, such as the embodiments illustrated in FIGS. 4 and 9, undesirable. The remaining steps of the method shown in FIG. 14 are the same as the remaining steps of the method shown in FIG. 13: step 1206, applying heat activated adhesive to the front panel; step 1208, applying heat activated adhesive to the replacement tile; step 1210, aligning the replacement tile; and 1212, curing the adhesive. As mentioned above with regard to FIG. 13 either one, or both, of steps 1206 and 1208 may be employed.

Though the exemplary methods illustrated in each of the FIGS. 12–14 are similar, each method may have advantages in a particular tiled display system. The method of FIG. 12 is the simplest of these exemplary methods for modular repair. The method of FIG. 12 may provide additional advantages as well, such as ensuring exact matching of the adhesive 500 bonding the replacement tile 120 to the front panel 2020 with the adhesive bonding the other tiles in the display to the front panel. This may be an issue, especially if the adhesive is tinted or used to provide another specific optical property. Also in some embodiments of a tiled display system, such as those illustrated in FIGS. 4 and 9, replacing or augmenting the adhesive during modular repair is undesirable, making the method shown in FIG. 12 the preferred approach.

One possible additional advantage afforded by the methods illustrated in FIGS. 13 and 14 are the certainty that an adequate amount of adhesive is provided to firmly bond the replacement tile to the surface. Another advantage may be the ability to use an improved adhesive that was not available at the time of initial assembly. In some cases, though, such as those mentioned above, the use of the method shown in FIG. 13 may prove undesirable. In cases where the use of the method shown in FIG. 13 proves undesirable, the use of the method of FIG. 14 may also be undesirable.

The method of modular repair illustrated in FIG. 14 may provide the additional advantage of assisting in formation of a more even adhesive layer 500 between replacement tile and the front panel. This method may also allow matching of the thickness of the adhesive used to couple the replacement tile to the front panel with that used to couple other tiles in the display. Another advantage may be the avoidance any possible problems associated with fatigue or deterioration, such as clouding or tinting, associated with repeated heat cycling of the adhesive.

Sometimes, compared to the method FIG. 12, the additional steps in the methods of modular repair illustrated by FIGS. 13 and 14 may prove unnecessary, or of negligible advantage. In such cases it is contemplated that the simpler method of FIG. 12 may be used. Likewise, if the additional step 1204, cleaning off the front panel, shown in FIG. 14, but not FIG. 13, is deemed unnecessary in a specific modular repair, then the method of FIG. 13 may be used in the place of the method of FIG. 14.

It is also contemplated that a substantially similar method of modular repair may be employed for tiled display system using an elastomeric compound as adhesive 500. The only differences would be that tile coupled to the transparent front panel using a elastomeric adhesive may be removed by cutting the adhesive and peeling off the tile rather than heating the adhesive.

Figure 15:
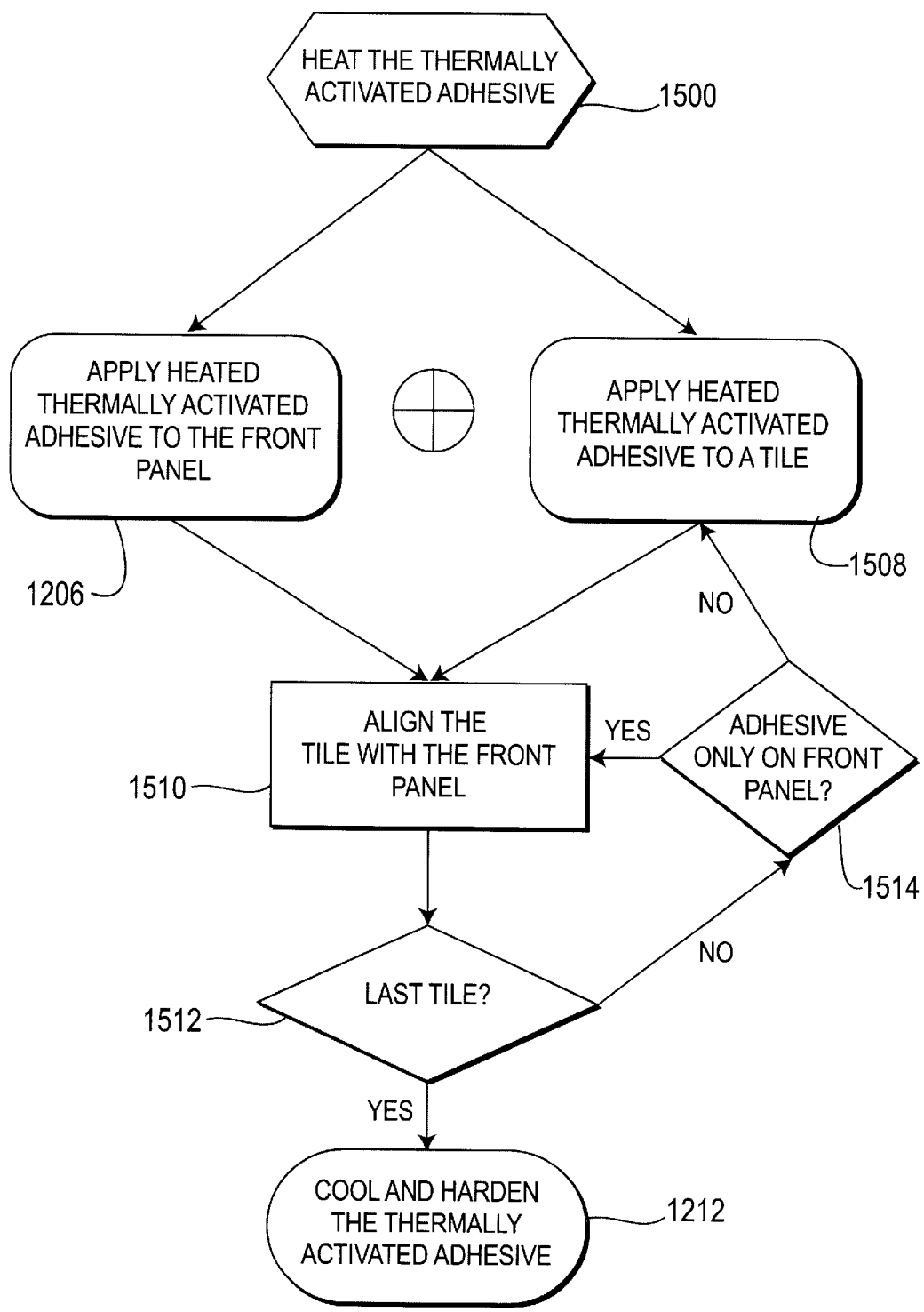
FIG. 15 is a flowchart describing an exemplary assembly method for a modular display system.

FIG. 15 illustrates an exemplary method of modular assembly of a tiled display system which is well suited to the exemplary modular repair methods of FIGS. 12–14. As with the exemplary repair methods of FIGS. 12–14, the exemplary assembly method described in FIG. 15 is explained with respect to an exemplary video display system in which the tiles 120 have been coupled to the transparent front panel 2020 of the display using a heat activated adhesive 500 as described above with regard to FIGS. 4–11A. It is contemplated that this exemplary method may be used to assemble other tiled optical systems, or with other adhesives which may be non-destructively unbonded.

The first step of the method of FIG. 15 is to heat the heat activated adhesive 500 to its working temperature, step 1500. Any of the heating method discussed with regard to step 1200 of FIGS. 12–14 may be used.

The heated adhesive is then applied to either the front panel of the display, step 1206, or a display tile, step 1508, or both. The choice of where to apply the adhesive may be determined by the embodiment of the tiled display system being constructed. For example, for a tiled display of the embodiment illustrated in FIG. 9 it may be desirable to apply the adhesive to front panel, step 1206, and not to apply the adhesive to the tile, step 1508.

Once the adhesive has been applied as desired, the tile is aligned to the front panel of the display, step 1510. This alignment may be assisted by mullions 1512, or a black matrix mask 2010, as illustrated in FIGS. 11 and 11A. Alternatively, the alignment may be in reference to only the frame of the display system 2014 and other tiles 120 in the display system.

Next it is determined if the tile just placed is the final tile in the display system, step 1512. If the tile is the final tile, then the construction continues to step 1212, curing the adhesive. Once the adhesive is cured, final assembly, including making electrical connection and attaching a back panel, may be accomplished.

If the tile is not the final tile in the display, then the procedure moves to step 1514, determining if the adhesive is only applied to front panel. If the adhesive is only applied to front panel in the embodiment being used, the procedure picks up at step 1510 aligning a new tile to the front panel. If the adhesive is applied to the tiles in this embodiment, then the procedure goes back to the application of the adhesive to the next tile, step 1508.

As in the repair methods of FIGS. 12–14, it should be noted that the adhesive may be allowed to cool between the application and completion of alignment of the replacement tile, then resoftened. It is also contemplated that it may be desirable to make alterations in the order of some of the operations in the assembly method of FIG. 15. Among the possible alterations may be: curing the adhesive, step 1212, after each tile is aligned; or, when step 1508 is employed, applying the adhesive to all of the tiles at once, this may be particularly advantageous for the embodiment shown in FIG. 4. Such modifications do not deviate from the scope of the present invention as defined by the appended claims.

Figure 16:
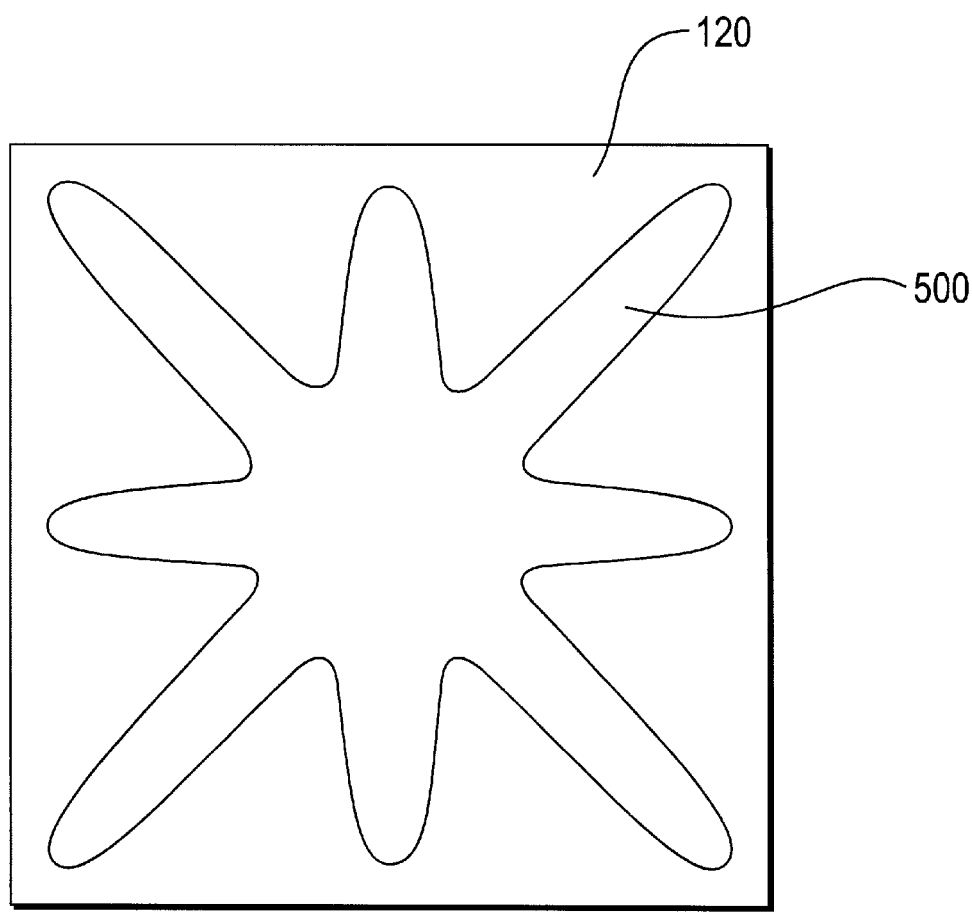
FIG. 16 is a front plan drawing of an exemplary display tile illustrating transparent adhesive which has been applied in an exemplary star pattern for assembly.

FIG. 16 illustrates an exemplary star pattern that may be used for applying transparent adhesive 500 to the surface of the glass substrate of a display tile 120. One issue, which may arise during the coupling of display tiles to a transparent front panel of the present invention, is the formation of pockets of gas trapped in a visible portion of the display. The application of the transparent adhesive in a star pattern may assist in avoiding such gas pockets. A similar method has been successfully employed to improve the adhesion of ceramic tiles in construction. Though the pattern in FIG. 16 is shown as an eight-sided star, it is contemplated that other patterns exist which may be used as well.

Additionally, it is contemplated that assembly, and modular repair, of the video display system of the present invention may be carried out in vacuo, thereby removing this possible problem.

Although the embodiments of the invention described above have been in terms of an OLED display device, it is contemplated that similar concepts may be practiced with other types of display tiles. Also, it will be understood to one skilled in the art that a number of other modifications exist which do not deviate from the scope of the present invention as defined by the appended claims.

What is claimed:

1. A tiled display structure comprising;
   a plurality of image tiles;
   a transparent front panel having an outer surface and an inner surface; and
   a heat activated adhesive coupling the plurality of tiles to the inner surface of the transparent front panel;
   wherein the heat activated adhesive softens with the application of heat and has a working temperature which is greater than an operating temperature of the plurality of tiles and less than a damage threshold temperature of the plurality of tiles.

2. The tiled display structure of claim 1, wherein each tile comprises;
   a circuit board; and
   a display section including a glass substrate having a front surface and a back surface including a plurality of pixel structures, each pixel structure defining a pixel area and having an active region which occupies a portion of the pixel area, the plurality of pixel structures being arranged in a matrix having rows and columns and including a plurality of contacts for receiving electrical signals.

3. The tiled display structure of claim 2, further comprising a black matrix mask having a plurality of rows and columns of dark-colored lines, the plurality of lines being substantially equal in width and defining a plurality of transparent regions oh the transparent front panel;
   wherein each of the plurality of transparent regions defined by the black matrix mask corresponds to an active region of a respective one of the pixel structures in the tiled display device.

4. The tiled display structure of claim 3, wherein the black matrix mask is coupled to the inner surface of the transparent front panel and the heat activated adhesive is disposed on the black matrix mask.

5. The tiled display structure of claim 4, wherein the plurality of lines in the black matrix mask contain resistive heating elements.

6. The tiled display structure of claim 3, wherein the black matrix mask is coupled to the outer surface of the transparent front panel.

7. The tiled display structure of claim 3, further comprising;
   a plurality of row mullions extending horizontally between the plurality of image tiles; and
   a plurality of column mullions extending vertically between the plurality of image tiles;
   wherein the heat activated adhesive is disposed on the plurality of row mullions and the plurality of column mullions.

8. The tiled display structure of claim 7, wherein the plurality of row mullions and the plurality of column mullions include one of resistive heating elements and absorptive heating elements.

9. The tiled display structure of claim 1, wherein the working temperature of the heat activated adhesive is greater than 80° C. and less than 150° C.

10. The tiled display structure of claim 1, wherein the heat activated adhesive is a thermoplastic material.

11. The tiled display structure of claim 10, wherein the thermoplastic material contains at least one of polystyrene and acrylic.

12. The tiled display structure of claim 2, wherein the heat activated adhesive is transparent.

13. The tiled display structure of claim 12, wherein the heat activated adhesive is disposed substantially evenly over the front surface of the glass substrate.

14. The tiled display structure of claim 2, further comprising a plurality of heating elements coupled to the glass substrates of the respective plurality of tiles.

15. The tiled display structure of claim 2, wherein;
   the heat activated adhesive is formed on the inner surface of the transparent front panel as a plurality of rows and columns of dark-colored lines, the plurality of lines being substantially equal in width and defining a plurality of transparent regions; and
   each of the plurality of transparent regions defined by the black matrix mask corresponds to the active region of a respective one of the pixel structures in a corresponding one of the image tiles.

16. A method of assembling a tiled display structure that includes a transparent front panel which has an inner surface and an outer surface, and a plurality of image tiles, each image tile including a display section which has a plurality of pixels in a matrix of rows and columns, the method comprising the steps of;
   heating a heat activated adhesive to a working temperature above a softening point temperature and below a damage threshold temperature of the plurality of image tiles;
   applying the heat activated adhesive to at least one of a surface of the display section of one of: a) the plurality of image tiles and b) the inner surface of the transparent front panel;
   bringing the surface of the display section of the one of the plurality of image tiles into alignment with the inner surface of the transparent front panel such that the heat activated adhesive forms a thin layer between the surface of the display section or the one of the plurality of image tiles and the inner surface of the transparent front panel; and
   cooling the heat activated adhesive to a temperature below the softening point temperature.

17. The method of claim 16 further comprising the step of coupling a black matrix mask containing a plurality of transparent regions to the transparent front panel using means which remain coupled at a temperature less than a bonding temperature which is greater than the working temperature.

18. The method of claim 17, wherein the step of bringing the surface of the display section of the one of the plurality of image tiles into alignment further comprises the step of arranging the one tile so that each pixel is centered on a respective one of the transparent regions of the black mask.

19. The method of claim 16 further comprising the step of coupling a plurality of row mullions and a plurality of column mullions to the inner surface of the transparent front panel using means which remain coupled at a temperature less than a bonding temperature which is greater than the working temperature, thereby defining a plurality of regions on the transparent front panel substantially corresponding with the plurality of image tiles in the tiled display device.

20. The method of claim 19, wherein the step of bringing the surface of the display section of the one of the plurality of image tiles into alignment further comprises the step of arranging the one tile of the plurality of image tiles so that the one tile is centered in one of the plurality of regions defined by the plurality of row mullions and the plurality of column mullions.

21. The method of claim 16, further comprising the step of placing the display section and the transparent front panel in a vacuum to prevent gas pockets from forming the thin layer of heated, heat activated adhesive when the one image tile is brought into alignment with the surface of the display section.

22. The method of claim 16, wherein the heat activated adhesive is applied to the at least one surface in a star pattern.

23. A method of repairing a tiled display structure that includes a transparent front panel which has an inner surface and an outer surface, a heat activated adhesive, and a plurality of image tiles including at least one defective tile, each image tile including a display section, the method comprising the steps of;

heating the heat activated adhesive to a working temperature above a softening point temperature and below a damage threshold temperature of the plurality of image tiles in a region of the tiled display structure corresponding to the at least one defective tile;

removing the at least one defective tile from the inner surface of the transparent front panel;

bringing a surface of a display section of a replacement image tile into alignment with a portion the inner surface of the transparent front panel in the region corresponding to the at least one defective tile such that the heat activated adhesive forms a thin layer between the surface of the display section of the replacement image tile and the inner surface of the transparent front panel; and cooling the heat activated adhesive to a temperature below the softening point temperature.

24. The method of claim 23 further comprising the step of applying further heat activated adhesive to at least one of a surface of a display section of a replacement image tile and a portion of the inner surface of the transparent front panel in the region of the defective tile before bringing the surface of the display section of the replacement image tile into alignment with the portion of the inner surface of the transparent front panel.

25. The method of claim 24 further comprising the step of removing the heat activated adhesive from the region of the inner surface of the transparent front panel corresponding to the defective tile before applying the further heat activated adhesive.

26. The method of claim 23 wherein the step of heating the heat activated adhesive includes at least one of;

exposing the region of the tiled display structure to heated air from a heat gun;

illuminating the region of the tiled display structure with an optical heat source;

contacting the region of the tiled display structure with a resistive heating element;

exposing the region of the tiled display structure to a microwave source;

exposing the region of the tiled display structure to a flame; and immersing the region of the tiled display structure in a hot liquid.

* * * * *